US011026253B2

(12) United States Patent
Venugopal et al.

(10) Patent No.: US 11,026,253 B2
(45) Date of Patent: Jun. 1, 2021

(54) MAPPING A PHYSICAL DOWNLINK CONTROL CHANNEL (PDCCH) ACROSS MULTIPLE TRANSMISSION CONFIGURATION INDICATION (TCI) STATES

(71) Applicant: QUALCOMM Incorporated, San Diego, CA (US)

(72) Inventors: Kiran Venugopal, Raritan, NJ (US); Makesh Pravin John Wilson, San Diego, CA (US); Tianyang Bai, Bridgewater, NJ (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/395,111

(22) Filed: Apr. 25, 2019

(65) Prior Publication Data
US 2019/0335492 A1 Oct. 31, 2019

Related U.S. Application Data

(60) Provisional application No. 62/663,188, filed on Apr. 26, 2018.

(51) Int. Cl.
| | |
|---|---|
| *H04W 72/12* | (2009.01) |
| *H04W 72/04* | (2009.01) |
| *H04L 5/00* | (2006.01) |
| *H04L 1/00* | (2006.01) |
| *H03M 13/13* | (2006.01) |

(52) U.S. Cl.
CPC ..... *H04W 72/1289* (2013.01); *H04W 72/042* (2013.01); *H04W 72/048* (2013.01); *H04W 72/0413* (2013.01); *H04W 72/0446* (2013.01)

(58) Field of Classification Search
CPC ........... H04W 72/1289; H04W 72/042; H04W 72/0446; H04W 72/048; H04W 72/0413; H04L 5/0053; H04L 1/0057; H04L 1/0072; H04L 5/0092; H03M 13/13
See application file for complete search history.

(56) References Cited

U.S. PATENT DOCUMENTS

| | | | |
|---|---|---|---|
| 2015/0222472 A1* | 8/2015 | Park | H04L 27/366 375/261 |
| 2019/0052487 A1* | 2/2019 | Shelby | H04L 1/0072 |

(Continued)

OTHER PUBLICATIONS

International Search Report and Written Opinion—PCT/US2019/029383—ISA/EPO—dated Jul. 8, 2019.

(Continued)

*Primary Examiner* — Harry H Kim
(74) *Attorney, Agent, or Firm* — Loza & Loza, LLP

(57) ABSTRACT

Aspects of the disclosure relate to mechanisms for mapping a physical downlink control channel (PDCCH) across multiple transmission configuration indication (TCI) states. In some examples, the PDCCH may then be encoded using a common mother polar code for each of a first set of control channel elements (CCEs) mapped to a first TCI state and a remaining set of CCEs mapped to a second TCI state. First and second portions of the encoded PDCCH may then be transmitted, such that the first portion includes the first set of CCEs, and the second portion includes the remaining set of CCEs.

24 Claims, 12 Drawing Sheets

(56) References Cited

U.S. PATENT DOCUMENTS

| | | | | |
|---|---|---|---|---|
| 2019/0141693 A1* | 5/2019 | Guo | ............... | H04L 5/0053 |
| 2019/0173740 A1* | 6/2019 | Zhang | ............... | H04W 24/10 |
| 2019/0230545 A1* | 7/2019 | Liou | ............... | H04W 16/28 |
| 2019/0312679 A1* | 10/2019 | Jayasinghe | ............... | H03M 13/095 |
| 2020/0021389 A1* | 1/2020 | Guan | ............... | H04L 1/0041 |
| 2020/0036497 A1* | 1/2020 | Xu | ............... | H04W 72/0453 |
| 2020/0186311 A1* | 6/2020 | Xu | ............... | H04W 72/044 |
| 2020/0245313 A1* | 7/2020 | Nl | ............... | H04L 5/00 |

OTHER PUBLICATIONS

NTT Docomo et al., "RAN WG's progress on NR WI in the January AH meeting 2018", 3GPP Draft; R2-1801889, 3RD Generation Partnership Project (3GPP), Mobile Competence Centre, 650, Route Des Lucioles, F-06921 Sophia-Antipolis Cedex France, vol. RAN WG2, No. Athens, Greece; Feb. 26, 2018-Mar. 2, 2018, Feb. 23, 2018 (Feb. 23, 2018), XP051400831, 109 Pages, Retrieved from the Internet: URL:http://www.3gpp.org/ftp/tsg%5Fran/WG2%5FRL2/TSGR2%5F101/Docs/ [retrieved on Feb. 23, 2018], pp. 52, 53, pp. 70, 71.

NTT Docomo et al., "Remaining issues on group-common PDCCH", 3GPP Draft; R1-1716096, 3RD Generation Partnership Project (3GPP), Mobile Competence Centre ; 650, Route Des Lucioles ; F-06921 Sophia-Antipolis Cedex, France, vol. RAN WG1, No. Nagoya, Japan; Sep. 18, 2017-Sep. 21, 2017, Sep. 17, 2017 (Sep. 17, 2017), XP051339554, 10 Pages, Retrieved from the Internet: URL:http://www.3gpp.org/ftp/Meetings_3GPP_SYNC/RAN1/Docs/ [retrieved on Sep. 17, 2017], sections 2, 3.

* cited by examiner

MAPPING A PHYSICAL DOWNLINK CONTROL CHANNEL (PDCCH) ACROSS MULTIPLE TRANSMISSION CONFIGURATION INDICATION (TCI) STATES

PRIORITY CLAIM

This application claims priority to and the benefit of Provisional Patent Application No. 62/663,188, entitled "System and Method That Facilitates Physical Downlink Control Channel (PDCCH) Mapping Across Multiple Transmission Configuration Indication (TCI) States," filed in the U.S. Patent and Trademark Office on Apr. 26, 2018, the entire contents of which are incorporated herein by reference as if fully set forth below in their entirety and for all applicable purposes.

TECHNICAL FIELD

The technology discussed below relates generally to wireless communication systems, and more particularly, to mapping a physical downlink control channel (PDCCH) across multiple transmission configuration indication (TCI) states.

INTRODUCTION

In wireless communication networks, a Physical Downlink Control Channel (PDCCH) carries control information, such as a resource allocation or grant for uplink (UL) and/or downlink (DL) transmissions. There are many locations (e.g., search spaces) in a subframe or slot where a specific PDCCH may be located, and a user equipment (UE) may search the possible search spaces to find the PDCCH(s) designated for the UE. Each search space may include a set of Control Channel Elements (CCEs) within which the UE may locate the PDCCH.

There are two types of search spaces: the common search space (CSS) and the UE-specific search space (USS). The common search space may carry common downlink control information (DCI) that is broadcasted to all UEs or a group of UEs, while the UE-specific search space may carry DCI for a specific UE. Each PDCCH search space candidate (common search space or UE-specific search space) may be associated with a transmission configuration indication (TCI) state that may indicate a quasi co-location (QCL) type and resources assigned to a demodulation reference signal (DMRS) for the PDCCH search space.

As the demand for mobile communications continues to increase, research and development continue to PDCCH mapping flexibility not only to meet the growing demand, but to advance and enhance the user experience with mobile communications.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure relate to mapping a physical downlink control channel (PDCCH) across multiple transmission configuration indication (TCI) states. In some examples, the PDCCH may include a first set of control channel elements (CCEs) mapped to a first TCI state and a remaining set of CCEs mapped to a second TCI state. A scheduling entity (e.g., a base station) may encode the PDCCH using a common mother polar code for each of the first set of CCEs and the remaining set of CCEs to produce an encoded PDCCH. The scheduling entity may further transmit the encoded PDCCH to a scheduled entity (e.g., a user equipment or UE).

The encoded PDCCH may include a first portion including the first set of CCEs mapped to the first TCI state and the second portion including a remaining set of CCEs mapped to the second TCI state. The scheduled entity may search a plurality of PDCCH search spaces for the encoded PDCCH including the first and second portions, identify a common mother polar code used to encode each of the first set of CCEs and the remaining set of CCEs, and decode at least one of the first portion of the encoded PDCCH or the second portion of the encoded PDCCH according to the common mother polar code.

In one aspect, the disclosure provide a method of wireless communication at a scheduling entity. The method includes mapping a physical downlink control channel (PDCCH) across multiple transmission configuration indication (TCI) states, in which the PDCCH includes a first set of control channel elements (CCEs) mapped to a first TCI state and a remaining set of CCEs mapped to a second TCI state. The method further includes encoding the PDCCH to produce an encoded PDCCH, where each of the first set of CCEs and the remaining set of CCEs are encoded according to a common mother polar code. The method further includes transmitting each of a first portion of the encoded PDCCH and a second portion of the encoded PDCCH to a scheduled entity, in which the first portion of the encoded PDCCH includes the first set of CCEs, and wherein the second portion of the encoded PDCCH includes the remaining set of CCEs.

In another aspect, the disclosure provides a scheduling entity in a wireless communication network that includes a processor, a memory communicatively coupled to the processor and a transceiver communicatively coupled to the processor. The processor is configured to map a physical downlink control channel (PDCCH) across multiple transmission configuration indication (TCI) states, in which the PDCCH includes a first set of control channel elements (CCEs) mapped to a first TCI state and a remaining set of CCEs mapped to a second TCI state. The processor is further configured to encode the PDCCH to produce an encoded PDCCH, where each of the first set of CCEs and the remaining set of CCEs are encoded according to a common mother polar code. The processor is further configured to transmit each of a first portion of the encoded PDCCH and a second portion of the encoded PDCCH to a scheduled entity, in which the first portion of the encoded PDCCH includes the first set of CCEs, and wherein the second portion of the encoded PDCCH includes the remaining set of CCEs.

In another aspect, the disclosure provides a method of wireless communication at a scheduled entity. The method includes searching a plurality of physical downlink control channel (PDCCH) search spaces for an encoded PDCCH transmitted by a scheduling entity. The encoded PDCCH includes a first portion comprising a first set of control channel elements (CCEs) mapped to a first transmission configuration indication (TCI) state and a second portion comprising a remaining set of CCEs mapped to a second TCI state. The method further includes identifying a common mother polar code used to encode each of the first set of CCEs and the remaining set of CCEs, and decoding at least one of the first portion of the encoded PDCCH or the second portion of the encoded PDCCH according to the common mother polar code.

In another aspect, the disclosure provides a scheduled entity in a wireless communication network that includes a processor, a memory communicatively coupled to the processor and a transceiver communicatively coupled to the processor. The processor is configured to search a plurality of physical downlink control channel (PDCCH) search spaces for an encoded PDCCH transmitted by a scheduling entity. The encoded PDCCH includes a first portion comprising a first set of control channel elements (CCEs) mapped to a first transmission configuration indication (TCI) state and a second portion comprising a remaining set of CCEs mapped to a second TCI state. The processor is further configured to identify a common mother polar code used to encode each of the first set of CCEs and the remaining set of CCEs, and decode at least one of the first portion of the encoded PDCCH or the second portion of the encoded PDCCH according to the common mother polar code.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

Figure 1:
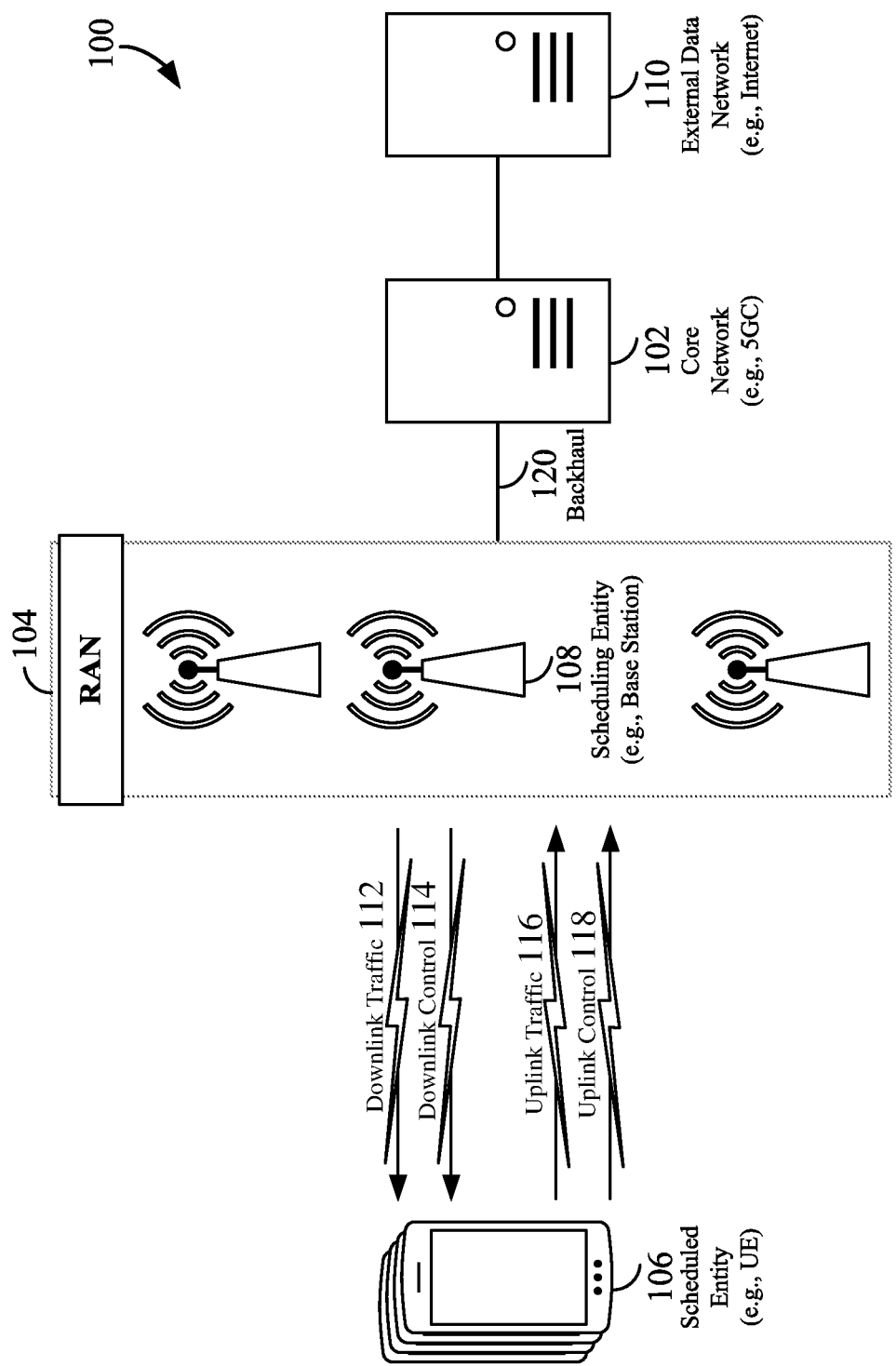
FIG. 1 is a schematic illustration of a wireless communication system.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and a user equipment (UE) 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to 3$^{rd}$ Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, e.g., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a scheduling entity 108 may broadcast downlink traffic 112 to one or more scheduled entities 106. Broadly, the scheduling entity 108 is a node or device responsible for scheduling traffic in a wireless communication network, including the downlink traffic 112 and, in some examples, uplink traffic 116 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
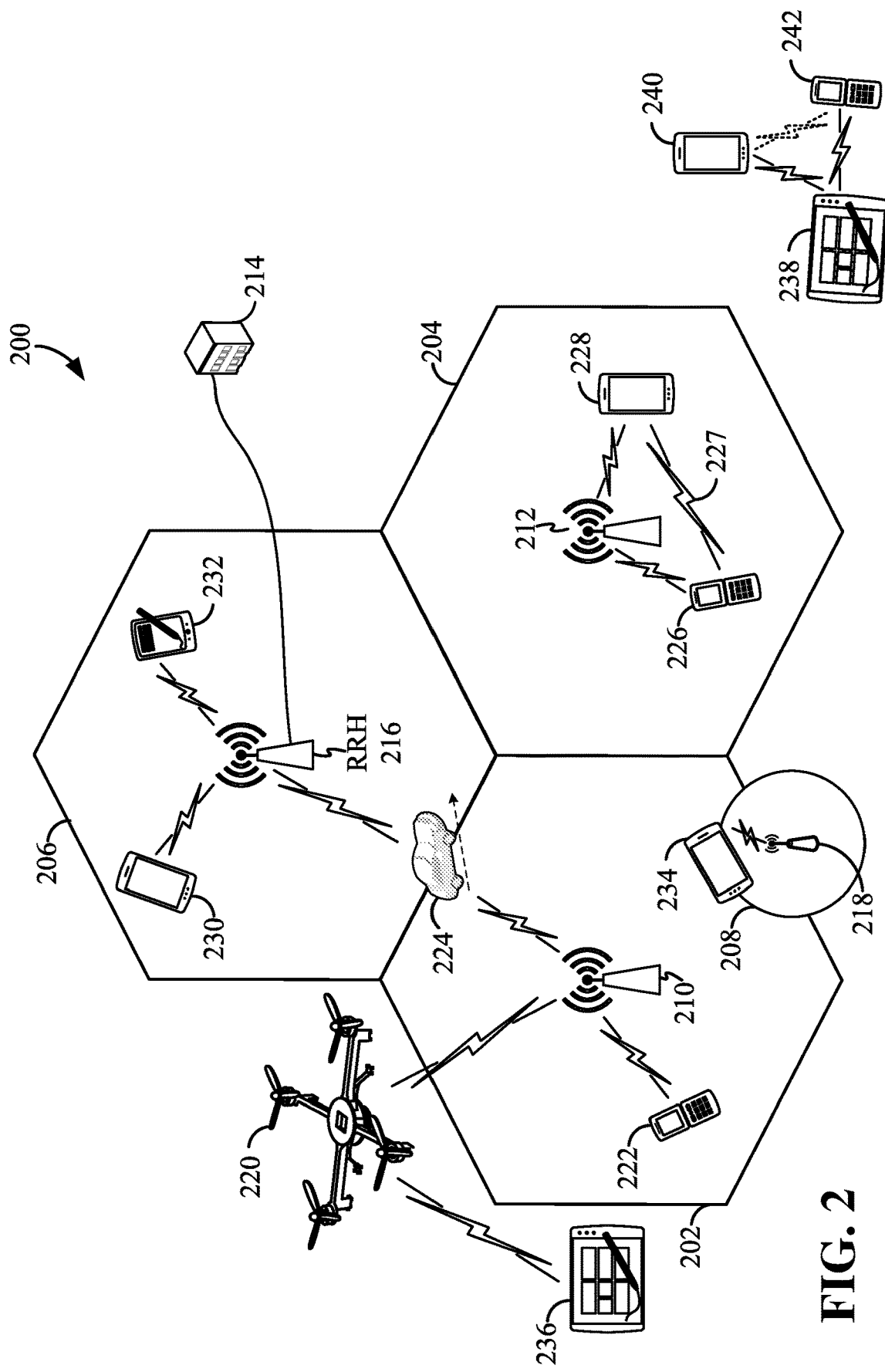
FIG. 2 is a conceptual illustration of an example of a radio access network.

Referring now to FIG. 2, by way of example and without limitation, a schematic illustration of a RAN 200 is provided. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 206 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station/scheduling entity 108 described above and illustrated in FIG. 1.

In some examples, an unmanned aerial vehicle (UAV) 220, which may be a quadcopter or drone 220, can be a mobile network node and may be configured to function as a base station. That is, in some examples, a cell may not necessarily be stationary, and the geographic area of the cell may move according to the location of a mobile base station such as the UAV 220. The UAV 220 may further be configured to function as a UE. For example, the UAV 220 may operate within cell 202 by communicating with base station 210.

Within the RAN 200, the cells may include UEs that may be in communication with one or more sectors of each cell. Further, each base station 210, 212, 214, 218, and 220 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. In some examples, the UEs 222, 224, 226, 228, 230, 232, 234, 236, 238, 240, and/or 242 may be the same as the UE/scheduled entity 106 described above and illustrated in FIG. 1.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the scheduling entity 238. Thus, in a wireless communication system with scheduled access to time-frequency resources and having a cellular configuration, a P2P configuration, or a mesh configuration, a scheduling entity and one or more scheduled entities may communicate utilizing the scheduled resources.

In the radio access network 200, the ability for a UE to communicate while moving, independent of its location, is referred to as mobility. The various physical channels between the UE and the radio access network are generally set up, maintained, and released under the control of an access and mobility management function (AMF, not illustrated, part of the core network 102 in FIG. 1), which may include a security context management function (SCMF) that manages the security context for both the control plane and the user plane functionality, and a security anchor function (SEAF) that performs authentication.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 200 may utilize one or more multiplexing and multiple access algorithms to enable simultaneous communication of the various devices. For example, 5G NR specifications provide multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier I-DMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

The air interface in the radio access network 200 may further utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

In order for transmissions over the radio access network 200 to obtain a low block error rate (BLER) while still achieving very high data rates, channel coding may be used. That is, wireless communication may generally utilize a suitable error correcting code. In a typical error correcting code, an encoder (e.g., a CODEC) at the transmitting device mathematically adds redundancy to an information message. Exploitation of this redundancy in the encoded information message can improve the reliability of the message, enabling correction for any bit errors that may occur due to noise.

Figure 3:
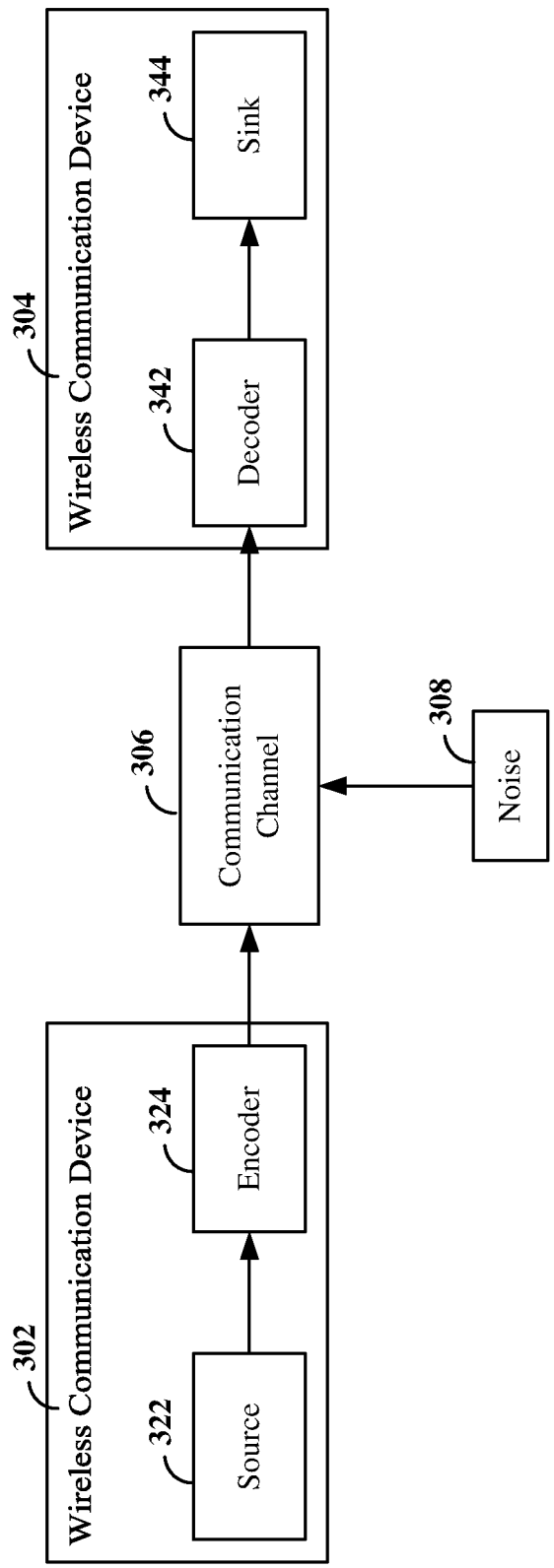
FIG. 3 is a schematic illustration of wireless communication utilizing block codes.

FIG. 3 is a schematic illustration of wireless communication between a first wireless communication device 302 and a second wireless communication device 304. Each wireless communication device 302 and 304 may be a user equipment (UE), a base station, or any other suitable apparatus or means for wireless communication. In the illustrated example, a source 322 within the first wireless communication device 302 transmits a digital message over a communication channel 306 (e.g., a wireless channel) to a sink 344 in the second wireless communication device 304. One issue in such a scheme that must be addressed to provide for reliable communication of the digital message, is to take into account noise 308 that affects the communication channel 306.

Error correcting codes are frequently used to provide reliable transmission of digital messages over such noisy channels. Examples of error correcting codes include block codes and convolutional codes. Convolutional codes convert the entire information message or sequence into a single codeword or code block, where the encoded bits depend not only on current information bits in the information message, but also on past information bits in the information message, thus providing redundancy.

Block codes split the information message up into blocks, each block having a length of K information bits. The encoder 324 at the first (transmitting) wireless communication device 302 then mathematically adds redundancy (e.g., parity bits) to the information message, resulting in codewords or code blocks having a length of N, where N>K. Here, the code rate R is the ratio between the message length and the block length: i.e., R=K/N before rate-matching. Thus, with block codes, the information bits are transmitted together with the parity bits. That is, the decoder 342 at the second (receiving) wireless communication device 304 can take advantage of the redundancy provided by the parity bits to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, polar codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

In early 5G NR specifications, user data is coded using quasi-cyclic low-density parity check (LDPC) with two different base graphs: one base graph is used for large code blocks and/or high code rates, while the other base graph is used otherwise. Control information and the physical broadcast channel (PBCH) are coded using polar coding, based on nested sequences. For these channels, puncturing, shortening, and repetition are used for rate matching.

Polar codes are linear block error correcting codes. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes (N, K). The codeword length N is a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

For example, an original information block may be represented as an information bit vector $u=(u_1, u_2, \ldots, u_N)$. At the transmitting wireless device 302, the encoder 324, which may be a polar encoder, may polar code the information bit vector to produce the polar codeword as an encoded bit vector $c=(c_1, c_2, \ldots, c_N)$ using a generating matrix $G_N = B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \dots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & & 1 & 1 & 0 & 0 \\ 1 & 0 & 1 & \dots & 1 & 0 & 1 & 0 \\ 1 & 1 & 1 & & 1 & 1 & 1 & 1 \end{bmatrix}$$

The polar encoder 324 may then generate the polar codeword as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar codeword c. In some examples, the information bit vector u may include a number of information bits, denoted K, and a number of frozen bits, denoted $f$. Frozen bits are bits that are set to a suitable predetermined value, such as 0 or 1. Thus, the value of the frozen bits may generally be known at both the transmitting device and the receiving device. The polar encoder 324 may determine the number of information bits and the number of frozen bits based on the code rate R. For example, the polar encoder 324 may select a code rate R from a set of one or more code rates and select K=N×R bits in the information block to transmit information. The remaining (N−K) bits in the information block may then be fixed as frozen bits $f$.

In order to determine which information block bits to set as frozen bits, the polar encoder 324 may further analyze the wireless channel over which the polar codeword may be sent. For example, the wireless channel for transmitting the polar codeword may be divided into a set of sub-channels, such that each encoded bit in the polar codeword is transmitted over one of the sub-channels. Thus, each sub-channel may correspond to a particular coded bit location in the polar codeword (e.g., sub-channel-1 may correspond to coded bit location containing coded bit $c_1$). The polar encoder 324 may identify the K best sub-channels (e.g., most reliable sub-channels) for transmitting the information bits and determine the original bit locations in the information block contributing to (or corresponding to) the K best sub-channels. For example, based on the generating matrix, one or more of the original bits of the information block may contribute to each of the coded bits of the polar codeword. Thus, based on the generating matrix, the polar encoder 324 may determine K original bit locations in the information block corresponding to the K best sub-channels, designate the K original bit locations in the information block for information bits and designate the remaining original bit locations in the information block for fixed bits.

In some examples, the polar encoder 324 may determine the K best sub-channels by performing Gaussian approximation. Gaussian approximation is generally known to those skilled in the art. In general, the polar encoder may perform Gaussian approximation to calculate a respective log likelihood ratio (LLR) for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the polar codeword, the LLRs of each of the original bit locations may be derived from the known LLRs of the coded bit locations by performing Gaussian approximation. Based on the calculated original bit location LLRs, the polar encoder 324 may sort the sub-channels and select the K best sub-channels (e.g., "good" sub-channels) to transmit the information bits.

The polar encoder 324 may then set the original bit locations of the information block corresponding to the K best sub-channels as including information bits and the remaining original bit locations corresponding to the N-K sub-channels (e.g., "bad" sub-channels) as including frozen bits. Bit-reversal permutation may then be performed by applying the bit-reversal permutation matrix $B_N$ described above to the N bits (including K information bits and N−K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar codeword. The polar encoder 324 may then transmit the polar codeword to the receiving wireless communication device 304.

The receiving wireless communication device 304 receives a noisy version of c, and the decoder 342, which may be a polar decoder, has to decode c or, equivalently, u, using a simple successive cancellation (SC) decoding algorithm. Successive cancellation decoding algorithms typically have a decoding complexity of O (N log N) and can achieve Shannon capacity when N is very large. However, for short and moderate block lengths, the error rate performance of polar codes significantly degrades.

Therefore, in some examples, the polar decoder 342 may utilize a SC-list decoding algorithm to improve the polar coding error rate performance With SC-list decoding, instead of only keeping one decoding path (as in simple SC decoders), L decoding paths are maintained, where L>1. At each decoding stage, the polar decoder 342 discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the polar decoder 342 will have a list of L candidates for $u_1^N$, out of which the most likely candidate is selected. Thus, when the decoder 242 completes the SC-list decoding algorithm, the decoder returns a single information block to the sink 244.

Various aspects of the present disclosure will be described with reference to an OFDM waveform, schematically illustrated in FIG. 4. It should be understood by those of ordinary skill in the art that the various aspects of the present disclosure may be applied to an SC-FDMA waveform in substantially the same way as described herein below. That is, while some examples of the present disclosure may focus on an OFDM link for clarity, it should be understood that the same principles may be applied as well to SC-FDMA waveforms.

Within the present disclosure, a frame refers to a duration of 10 ms for wireless transmissions, with each frame consisting of 10 subframes of 1 ms each. On a given carrier, there may be one set of frames in the UL, and another set of frames in the DL. Referring now to FIG. 4, an expanded view of an exemplary subframe 402 is illustrated, showing an OFDM resource grid 404. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers or tones.

The resource grid 404 may be used to schematically represent time-frequency resources for a given antenna port. That is, in a MIMO implementation with multiple antenna ports available, a corresponding multiple number of resource grids 404 may be available for communication. The resource grid 404 is divided into multiple resource elements (REs) 406. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 408, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain. Within the present disclosure, it is assumed that a single RB such as the RB 408 entirely corresponds to a single direction of communication (either transmission or reception for a given device).

A UE generally utilizes only a subset of the resource grid 404. An RB may be the smallest unit of resources that can be allocated to a UE. Thus, the more RBs scheduled for a UE, and the higher the modulation scheme chosen for the air interface, the higher the data rate for the UE.

In this illustration, the RB 408 is shown as occupying less than the entire bandwidth of the subframe 402, with some subcarriers illustrated above and below the RB 408. In a given implementation, the subframe 402 may have a bandwidth corresponding to any number of one or more RBs 408. Further, in this illustration, the RB 408 is shown as occupying less than the entire duration of the subframe 402, although this is merely one possible example.

Each 1 ms subframe 402 may consist of one or multiple adjacent slots. In the example shown in FIG. 4, one subframe 402 includes four slots 410, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., one or two OFDM symbols). These mini-slots may in some cases be transmitted occupying resources scheduled for ongoing slot transmissions for the same or for different UEs.

An expanded view of one of the slots 410 illustrates the slot 410 including a control region 412 and a data region 414. In general, the control region 412 may carry control channels (e.g., PDCCH), and the data region 414 may carry data channels (e.g., PDSCH or PUSCH). Of course, a slot may contain all DL, all UL, or at least one DL portion and at least one UL portion. The simple structure illustrated in FIG. 4 is merely exemplary in nature, and different slot structures may be utilized, and may include one or more of each of the control region(s) and data region(s).

Figure 4:
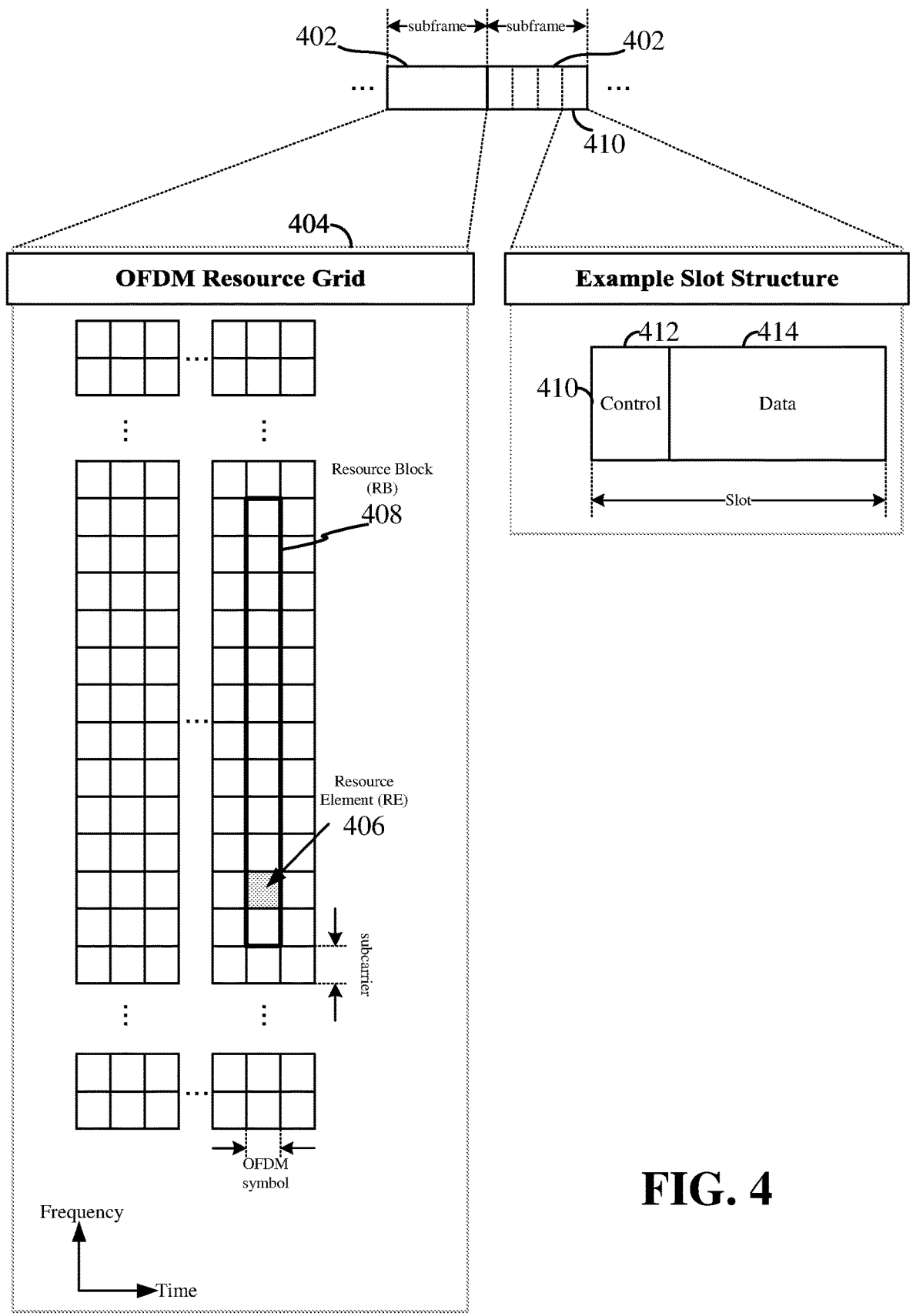
FIG. 4 is a schematic illustration of an organization of wireless resources in an air interface utilizing orthogonal frequency divisional multiplexing (OFDM).

Although not illustrated in FIG. 4, the various REs 406 within a RB 408 may be scheduled to carry one or more physical channels, including control channels, shared channels, data channels, etc. Other REs 406 within the RB 408 may also carry pilots or reference signals, including but not limited to a demodulation reference signal (DMRS) a control reference signal (CRS), or a sounding reference signal (SRS). These pilots or reference signals may provide for a receiving device to perform channel estimation of the corresponding channel, which may enable coherent demodulation/detection of the control and/or data channels within the RB 408.

In a DL transmission, the transmitting device (e.g., the scheduling entity 108) may allocate one or more REs 406 (e.g., within a control region 412) to carry DL control information 114 including one or more DL control channels, such as a PBCH; a PSS; a SSS; a physical control format indicator channel (PCFICH); a physical hybrid automatic repeat request (HARQ) indicator channel (PHICH); and/or a physical downlink control channel (PDCCH), etc., to one or more scheduled entities 106. The PCFICH provides information to assist a receiving device in receiving and decoding the PDCCH. The PDCCH carries downlink control information (DCI) including but not limited to power control commands, scheduling information, a grant, and/or an assignment of REs for DL and UL transmissions. The PHICH carries HARQ feedback transmissions such as an acknowledgment (ACK) or negative acknowledgment (NACK). HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission confirmed, an ACK may be transmitted, whereas if not confirmed, a NACK may be transmitted. In response to a NACK, the transmitting device may send a HARQ retransmission, which may implement chase combining, incremental redundancy, etc.

In an UL transmission, the transmitting device (e.g., the scheduled entity 106) may utilize one or more REs 406 to carry UL control information 118 including one or more UL control channels, such as a physical uplink control channel (PUCCH), to the scheduling entity 108. UL control information may include a variety of packet types and categories, including pilots, reference signals, and information configured to enable or assist in decoding uplink data transmissions. In some examples, the control information 118 may include a scheduling request (SR), e.g., a request for the scheduling entity 108 to schedule uplink transmissions. Here, in response to the SR transmitted on the control channel 118, the scheduling entity 108 may transmit downlink control information 114 that may schedule resources for uplink packet transmissions. UL control information may also include HARQ feedback, channel state feedback (CSF), or any other suitable UL control information.

In addition to control information, one or more REs 406 (e.g., within the data region 414) may be allocated for user data or traffic data (collectively, hereinafter referred to as "traffic"). Such traffic may be carried on one or more traffic channels, such as, for a DL transmission, a physical downlink shared channel (PDSCH); or for an UL transmission, a physical uplink shared channel (PUSCH). In some examples, one or more REs 406 within the data region 414 may be configured to carry system information blocks (SIBs), carrying information that may enable access to a given cell.

The channels or carriers described above and illustrated in FIGS. 1 and 4 are not necessarily all the channels or carriers that may be utilized between a scheduling entity 108 and scheduled entities 106, and those of ordinary skill in the art will recognize that other channels or carriers may be utilized in addition to those illustrated, such as other traffic, control, and feedback channels.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

As indicated above, the PDCCH carries downlink control information (DCI), including but not limited to power control commands, scheduling information, a grant, and/or an assignment of REs for DL and UL transmissions. The PDCCH may be transmitted over an aggregation of contiguous control channel elements (CCEs) in the control section of the subframe 402 or slot 410. In some examples, one CCE includes six resource element groups (REGs) where a REG equals one resource block 408 during one orthogonal frequency division multiplexing (OFDM) symbol. In addition, 5G NR supports a "time-first" mapping scheme, in which REGs within a control resource set (CORESET) are numbered in increasing order in a time-first manner, starting with 0 for the first OFDM symbol and the lowest numbered resource block in the control resource set. A CORESET is made up of multiples resource blocks (i.e., multiples of 12 resource elements) in the frequency domain and one, two, or three OFDM symbols in the time domain.

In some examples, the PDCCH may be constructed from a variable number of CCEs, depending on the PDCCH format (or aggregation level). Each PDCCH format (or aggregation level) supports a different DCI length. In some examples, PDCCH aggregation levels of 1, 2, 4, and 8 may be supported, corresponding to 1, 2, 4, or 8 contiguous CCEs, respectively.

The DCI within the PDCCH provides downlink resource assignments and/or uplink resource grants for one or more scheduled entities. Multiple PDCCHs may be transmitted each subframe or slot and each PDCCH may carry user-specific DCI or common DCI (e.g., control information broadcast to a group of scheduled entities). Each DCI may further include a cyclic redundancy check (CRC) bit that is scrambled with a radio network temporary identifier (RNTI), which may be a specific user RNTI or a group RNTI, to allow the UE to determine the type of control information sent in the PDCCH.

Since the UE is unaware of the particular aggregation level of the PDCCH or whether multiple PDCCHs may exist for the UE in the subframe 402 or slot 410, the UE may perform blind decoding of various decoding candidates within the first N control OFDM symbols identified by the CFI of the PCFICH. Each decoding candidate includes a collection of one or more consecutive CCEs based on an assumed DCI length (e.g., PDCCH aggregation level). To limit the number of blind decodes, a UE-specific search space and a common search space may be defined. The search spaces limit the number of blind decodes that the UE performs for each PDCCH format combination. The common search space consists of CCEs used for sending control information that is common to a group of UEs. Thus, the common search space is monitored by all UEs in a cell and may be static between subframes or slots. The UE-specific search space consists of CCEs used for sending control information for particular UEs. The starting point (offset or index) of a UE-specific search space may be different for each UE and each UE may have multiple UE-specific search spaces (e.g., one for each aggregation level). The UE may perform blind decoding over all aggregation levels and corresponding UE-specific search spaces to determine whether at least one valid DCI exists for the UE within the UE-specific search space(s).

Each PDCCH search space candidate (common search space or UE-specific search space) may be associated with a transmission configuration indication (TCI) state. Here, a TCI state indicates quasi co-location (QCL) information (e.g., QCL Type and time-frequency resources) of a demodulation reference signal (DMRS) for the PDCCH search space candidate. Example of QCL types may include one or more of Doppler shift, Doppler spread, average delay, delay spread, and a spatial RX (receiving) parameter. However, due to blocking or outage (e.g., beam blockage due to user movement), one or more of the PDCCH search space candidates may not be detected by a user equipment (UE).

In various aspects of the disclosure, a PDCCH may be mapped across multiple TCI states (e.g., across multiple PDCCH search space candidates) to improve detectability of the PDCCH. In some examples, a "frequency-first" mapping scheme (instead of a "time-first" mapping scheme) for PDCCHs with multiple TCI states may be implemented to simplify CCE mapping by facilitating sequential processing and to further simplify decoding at the receiver (e.g., the UE may search for the CCE groups one after another per OFDM symbol, thus enabling soft-combining on a per-symbol basis). A "frequency-first" mapping scheme may number REGs within a CORESET in increasing order in a frequency-first manner, starting with 0 for the lowest numbered resource block in the CORESET (regardless of the OFDM symbol).

For example, such a scheme may be triggered via a radio resource control (RRC) message or a medium access control (MAC) control element (CE). Although a frequency-first scheme may simplify CCE mapping for PDCCHs with multiple TCI states, mapping PDCCHs across multiple TCI states in 5G NR presents unique challenges. Namely, because PDCCHs in 5G NR are encoded with polar codes, CCEs mapped across multiple TCIs may potentially result in different polar codes for each TCI part, where a TCI part corresponds to a set of CCEs mapped to a particular TCI state.

Figure 5:
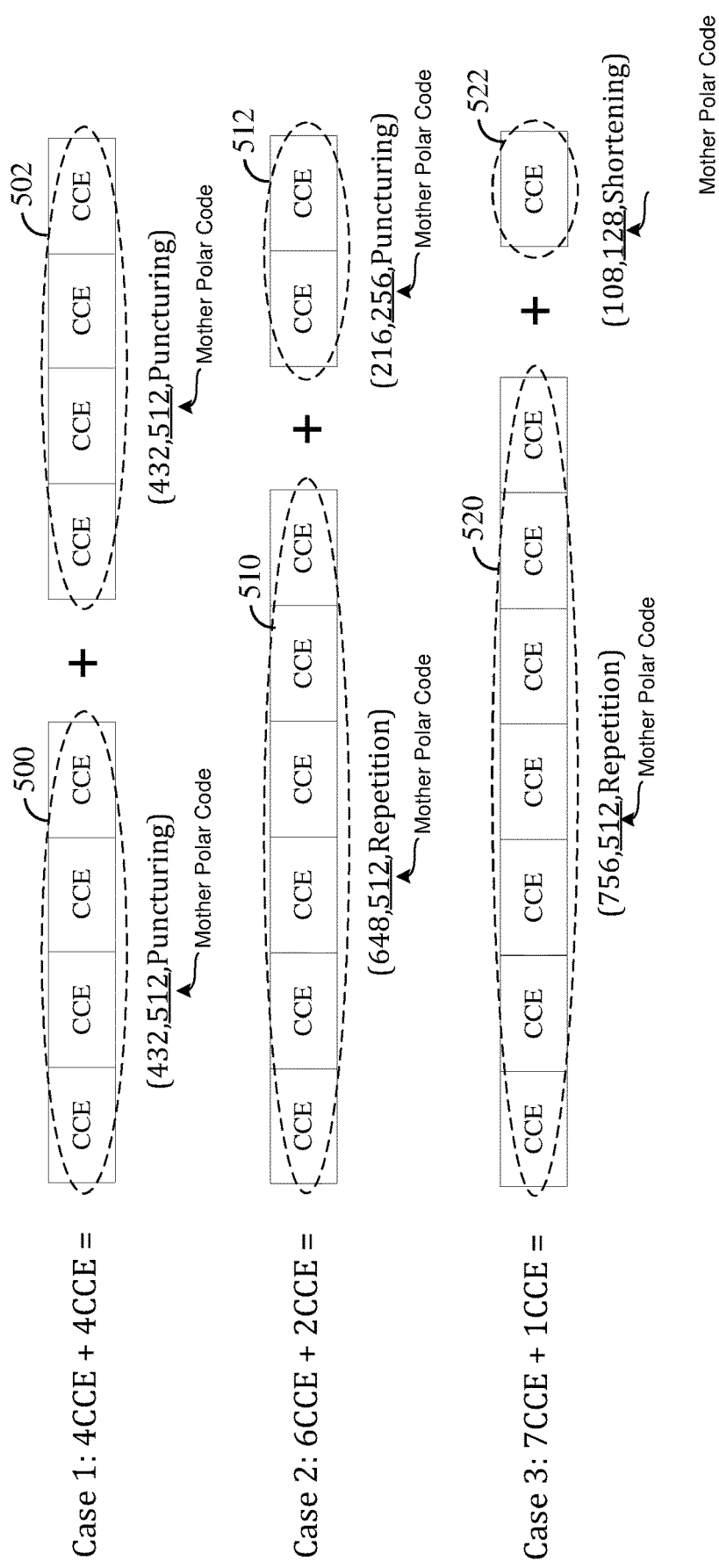
FIG. 5 is an illustration of exemplary mappings of control channel elements (CCEs) across multiple transmission configuration indication (TCI) states.

FIG. 5 provides an illustration of exemplary mappings of CCEs across multiple TCI states in which each TCI part may result in a different corresponding polar code. As illustrated, three exemplary cases are provided in which an aggregation of 8 CCEs is assumed (i.e., 8 total CCEs) for a PDCCH, and where CCEs are encoded according to a mother polar code that is either punctured (i.e., one or more code bits are not transmitted, which are treated as erased at the decoder), shortened (i.e., a subcode is introduced such that one or more code bits assume a fixed value, typically zero, and not transmitted since they are known at the decoder), or repeated (i.e., where only the most significant location contains an information bit while all the other locations are frozen). As used herein, the term "mother polar code" refers to a polar code for producing a codeword of a particular length (e.g., a particular number of coded bits) before puncturing, shortening or repeating.

In case 1, a first TCI part 500 includes a set of four CCEs encoded with the same mother polar code as a second TCI part 502 that also includes a set of four CCEs, as shown. In case 2, however, a first TCI part 510 includes a set of six CCEs encoded with a different mother polar code as a second TCI part 512 including a set of two CCEs, as shown. Similarly, in case 3, a first TCI part 520 includes a set of seven CCEs encoded with a different mother polar code as a second TCI part 522 that includes a remaining CCE, as shown. Therefore, since the TCI parts in each of cases 2 and 3 use a different mother polar code, neither case provides a direct way of combining at the receiver if both parts are present.

To overcome this, aspects disclosed herein include performing such mapping by encoding PDCCHs with a common mother polar code for each TCI state. Here, it should be noted that TCI parts are defined to have a "same" or "common" mother polar code if both TCI parts use the same K number of information bits and use the same generator matrix to first derive N output bits. The transmitted coded bits may be different for each TCI state (e.g., for rate-matching to the required aggregation level), which may be derived via a different shortening/puncturing or repetition of the N output bits for each TCI state.

Figure 6:
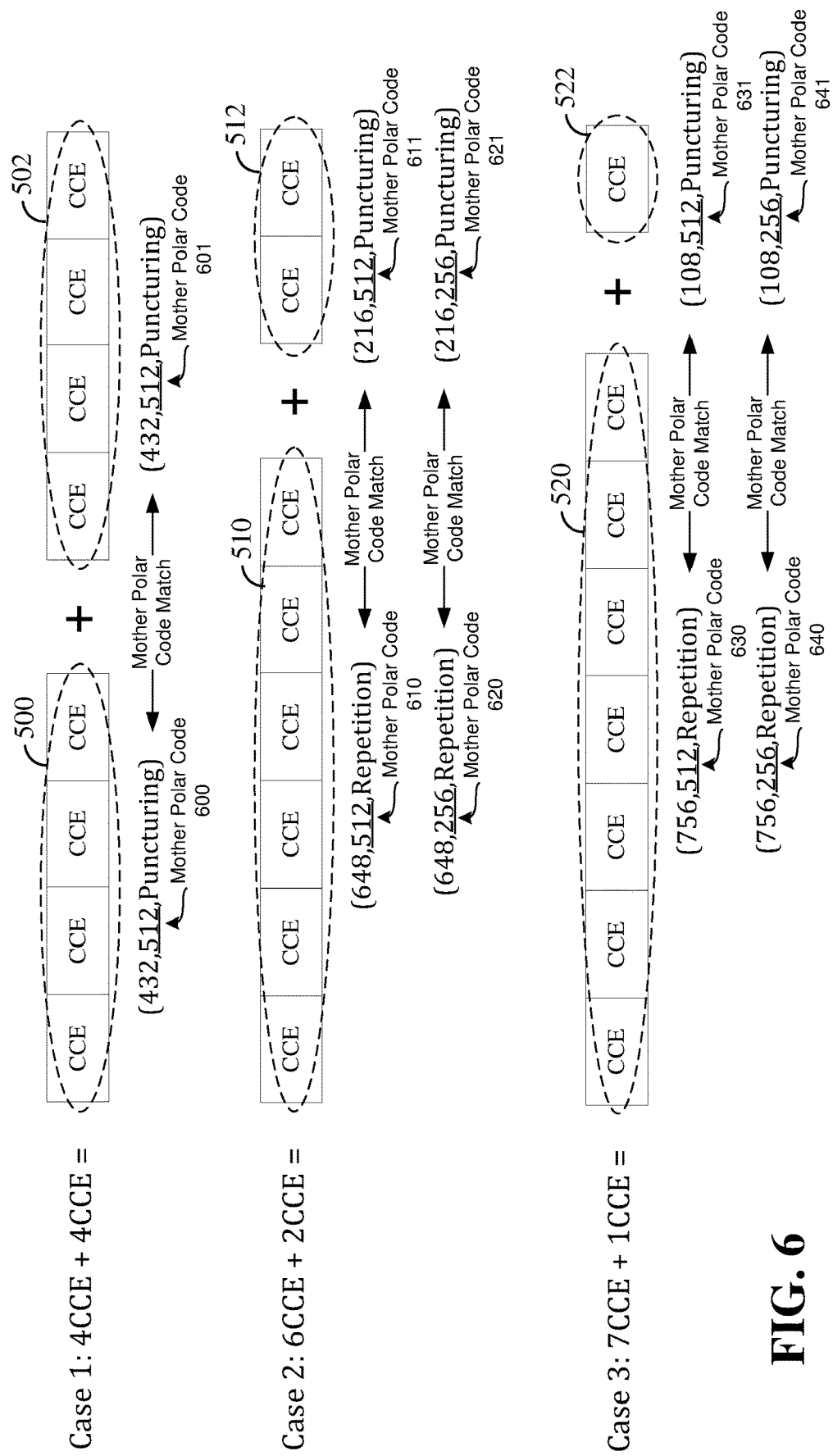
FIG. 6 is an illustration of exemplary mappings of CCEs across multiple TCI states.

Referring next to FIG. 6, exemplary mappings are provided for the three cases illustrated in FIG. 5, in which each case utilizes a common mother polar code for each TCI state of a PDCCH. As illustrated, since case 1 in FIG. 5 already utilizes a common mother polar code for each TCI part 500 and 502, no modification from the mapping is needed. Namely, as illustrated in FIG. 6, the mother polar code 600 corresponding to TCI part 500 matches with mother polar code 601 corresponding to TCI part 502. For case 2, however, FIG. 6 provides two alternative mappings in which a common mother polar code is used for each TCI part 510 and 512. Namely, as illustrated, a first mapping is provided in which the mother polar code 610 corresponding to TCI part 510 matches with mother polar code 611 corresponding to TCI part 512, and a second mapping is provided in which the mother polar code 620 corresponding to TCI part 510 matches with mother polar code 621 corresponding to TCI part 512. Similarly, FIG. 6 provides two alternative mappings for case 3 in which a common mother polar code is used for each TCI part 520 and 522. Namely, as illustrated, a first mapping is provided in which the mother polar code 630 corresponding to TCI part 520 matches with mother polar code 631 corresponding to TCI part 522, and a second mapping is provided in which the mother polar code 640 corresponding to TCI part 520 matches with mother polar code 641 corresponding to TCI part 522.

By having each TCI state use the same mother polar code, a soft combining mechanism may be used across TCI states. In addition, even if one of the TCI parts is blocked, the other TCI part(s) may still be used since each TCI part is self-decodable. Furthermore, the mapping scheme disclosed herein provides more design flexibility with non-uniform numbers of CCEs per TCI state. In some examples, a polar code mapping mode indicator that indicates that the PDCCH is mapped across two or more TCI states may be triggered via a radio resource control (RRC) message or a medium access control-control element (MAC-CE).

It should be appreciated that although the implementations disclosed herein are described within the context of mapping a PDCCH, the same concepts can similarly apply to mapping payloads of the physical uplink control channel (PUCCH) when such payloads use polar coding and are mapped across multiple TCI states. Namely, aspects disclosed herein also encompass mapping PUCCH payloads across multiple TCI states, in which the PUCCH payloads are encoded with a common mother polar code for each TCI state.

Figure 7:
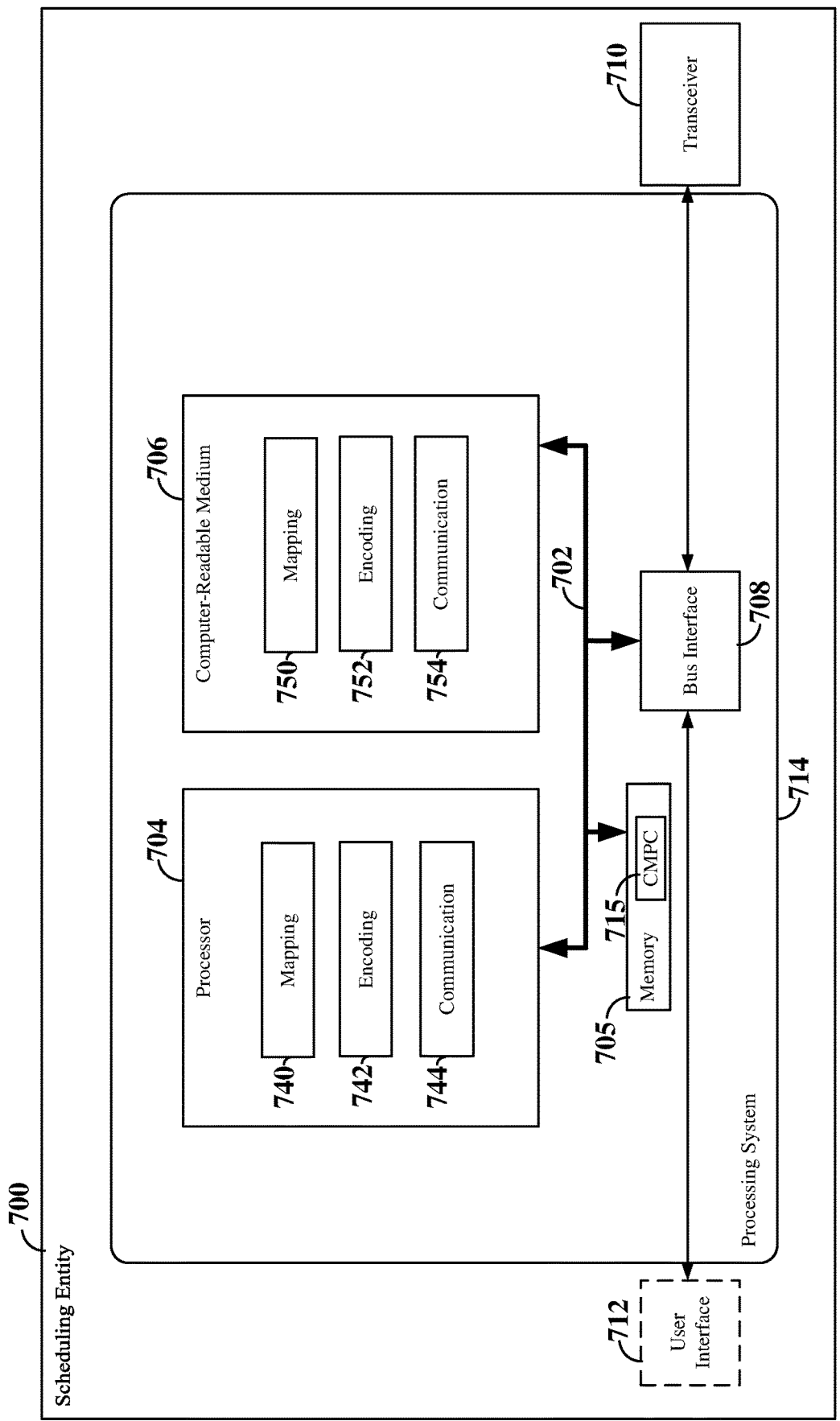
FIG. 7 is a block diagram illustrating an example of a hardware implementation for a scheduling entity employing a processing system.

FIG. 7 is a block diagram illustrating an example of a hardware implementation for a scheduling entity 700 employing a processing system 714. For example, the scheduling entity 700 may be a base station as also illustrated in any one or more of FIGS. 1, 2, and/or 3. In another example, the scheduling entity 700 may be a user equipment (UE) as illustrated in any one or more of FIGS. 1, 2 and/or 3

The scheduling entity 700 may be implemented with a processing system 714 that includes one or more processors 704. The term "processor" or "processors" may be used herein according to the structural meaning thereof. Examples of processors 704 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 700 may be configured to perform any one or more of the functions described herein. That is, the processor 704, as utilized in a scheduling entity 700, may be used to implement any one or more of the processes and procedures described below. The processor 704 may in some instances be implemented via a baseband or modem chip and in other implementations, the processor 704 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 714 may be implemented with a bus architecture, represented generally by the bus 702. The bus 702 may include any number of interconnecting buses and bridges depending on the specific application of the processing system 714 and the overall design constraints. The bus 702 communicatively couples together various circuits including one or more processors (represented generally by the processor 704), a memory 705, and computer-readable media (represented generally by the computer-readable medium 706). The bus 702 may also link various other circuits such as timing sources, peripherals, voltage regulators, and power management circuits, which are well known in the art, and therefore, will not be described any further. A bus interface 708 provides an interface between the bus 702 and a transceiver 710. The transceiver 710 provides a communication interface or means for communicating with various other apparatus over a transmission medium. Depending upon the nature of the apparatus, a user interface 712 (e.g., keypad, display, speaker, microphone, joystick) may also be provided. Of course, such a user interface 712 is optional, and may be omitted in some examples, such as a base station.

The processor 704 is responsible for managing the bus 702 and general processing, including the execution of software stored on the computer-readable medium 706. The software, when executed by the processor 704, causes the processing system 714 to perform the various functions described below for any particular apparatus. The computer-readable medium 706 and the memory 705 may also be used for storing data that is manipulated by the processor 704 when executing software. In some examples, the computer-readable medium 706 may be integrated with the memory 705.

One or more processors 704 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable storage medium 706.

The computer-readable storage medium 706 may be a non-transitory computer-readable storage medium. A non-transitory computer-readable storage medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable storage medium may also include, by way of example, a carrier wave, a transmission line, and any other suitable medium for transmitting software and/or instructions that may be accessed and read by a computer. The computer-readable storage medium 706 may reside in the processing system 714, external to the processing system 714, or distributed across multiple entities including the processing system 714. The computer-readable storage medium 306 may be embodied in a computer program product. By way of example, a computer program product may include a computer-readable storage medium in packaging materials. Those skilled in the art will recognize how best to implement the described functionality presented throughout this disclosure depending on the particular application and the overall design constraints imposed on the overall system.

In some aspects of the disclosure, the processor 704 may include circuitry configured for various functions. In some examples, the circuitry may be included within a general purpose processor. In other examples, the circuitry may be specialized circuitry configured to perform the various functions. For example, the processor 704 may include mapping circuitry 740 configured for various functions, including, for example, to map a physical downlink control channel (PDCCH) across multiple transmission configuration indication (TCI) states. In some examples, the mapping circuitry 740 may map a first set of control channel elements (CCEs) of the PDCCH to a first TCI state and a remaining set of CCEs of the PDCCH to a second TCI state. In some examples, the mapping circuitry 740 may further map the first set of CCEs of the PDCCH (that are mapped to a first TCI state) to a first control resource set (CORESET), and the remaining set of CCEs of the PDCCH (that are mapped to the second TCI state) to a second CORESET. The mapping circuitry 740 may further be configured to execute mapping software 750 stored on the computer-readable medium 706 to implement one or more functions described herein.

The processor 704 may also include an encoding circuitry 742 configured for various functions, including polar coding one or more PDCCHs. For example, the encoding circuitry 742 may be configured to encode a PDCCH such that each of the first set of CCEs and the remaining set of CCEs are encoded according to a common mother polar code (CMPC) 715, which may be maintained, for example, in memory 705. In some examples, the encoding circuitry 742 may further be configured to encode the PDCCH based on feedback received from the scheduled entity. In some examples, the feedback may indicate the mother polar code to utilize in encoding the PDCCH (e.g., the scheduled entity may indicate a preference for a particular mother code). In some examples, the feedback may include a reference signal received power (RSRP) or signal-to-interference-plus-noise ratio (SINR) of the TCI states over which the PDCCH is encoded. For example, if one of the RSRP/SINR of one of the TCI states is poor, the scheduling entity may select a higher aggregation level on that beam for improved robustness. Thus, the number of CCEs utilized may be based on the feedback. The encoding circuitry 742 may further be configured to execute encoding software 752 stored on the computer-readable medium 706 to implement one or more functions described herein.

The processor 704 may further include communication circuitry 744 configured for various functions. The communication circuitry 744 may include one or more hardware components that provide the physical structure that performs various processes related to wireless communication (e.g., signal reception and/or signal transmission) as described herein. The communication circuitry 744 may include one or more hardware components that provide the physical structure that performs various processes related to signal processing (e.g., processing a received signal and/or processing a signal for transmission) as described herein.

In some examples, the communication circuitry 744 may be configured to transmit each of a first portion of the encoded PDCCH and a second portion of the encoded PDCCH to a scheduled entity via the transceiver 710. For example, the first portion of the encoded PDCCH may include the first set of CCEs, and the second portion of the encoded PDCCH may include the remaining set of CCEs. The communication circuitry 744 may further be configured to receive feedback from the scheduled entity indicating the CMPC 715 via the transceiver.

The communication circuitry 744 may further be configured to generate and transmit a polar code mapping mode indication to the scheduled entity, in which the indication indicates that the PDCCH is mapped across multiple TCI states. For example, the communication circuitry 744 may be configured to transmit the indication within downlink control information (DCI). The communication circuitry 744 may be further be configured to transmit the indication within either a radio resource control (RRC) message or a medium access control-control element (MAC-CE). The communication circuitry 744 may further be configured to execute communication software 754 stored on the computer-readable medium 706 to implement one or more of the functions described herein.

Figure 8:
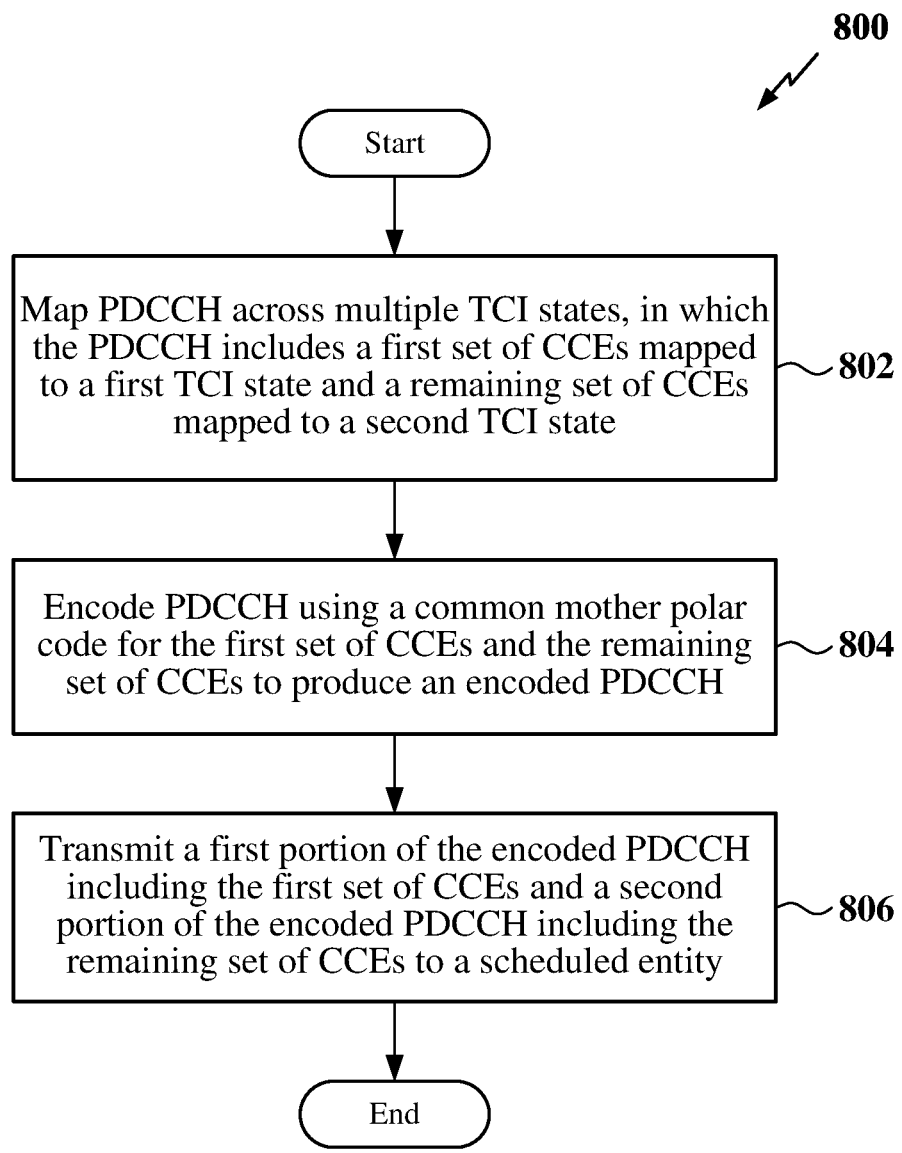
FIG. 8 is a flow chart illustrating an exemplary process for mapping a PDCCH across multiple TCI states.

FIG. 8 is a flow chart 800 of a method for mapping a PDCCH across multiple TCI states. As described below, some or all illustrated features may be omitted in a particular implementation within the scope of the present disclosure, and some illustrated features may not be required for implementation of all embodiments. In some examples, the method may be performed by the scheduling entity 700, as described above and illustrated in FIG. 7, by a processor or processing system, or by any suitable means for carrying out the described functions.

At block 802, the scheduling entity may map a PDCCH across multiple TCI states, in which the PDCCH includes a first set of CCEs mapped to a first TCI state and a remaining set of CCEs mapped to a second TCI state. In some examples, the scheduling entity may further map the first set of CCEs to a first control resource set (CORESET), and the remaining set of CCEs to a second CORESET. For example, the mapping circuitry 740 shown and described above in connection with FIG. 7 may map the PDCCH across multiple TCI states.

At block 804, the scheduling entity may encode the PDCCH using a common mother polar code for the first set of CCEs and the remaining set of CCEs to produce an encoded PDCCH. In some examples, the scheduling entity may receive feedback from the scheduled entity indicating the mother polar code to utilize to encode the PDCCH across multiple TCI states, and the scheduling entity may encode the PDCCH to produce the encoded PDCCH based on the feedback. For example, the encoding circuitry 742 shown and described above in connection with FIG. 7 may encode the PDCCH using a common mother polar code.

At block 806, the scheduling entity may transmit a first portion of the encoded PDCCH including the first set of CCEs and a second portion of the encoded PDCCH including the remaining set of CCEs to a scheduled entity. For example, the communication circuitry 744, together with the transceiver 710, shown and described above in connection with FIG. 7 may transmit the first and second PDCCH portions to the scheduled entity.

Figure 9:
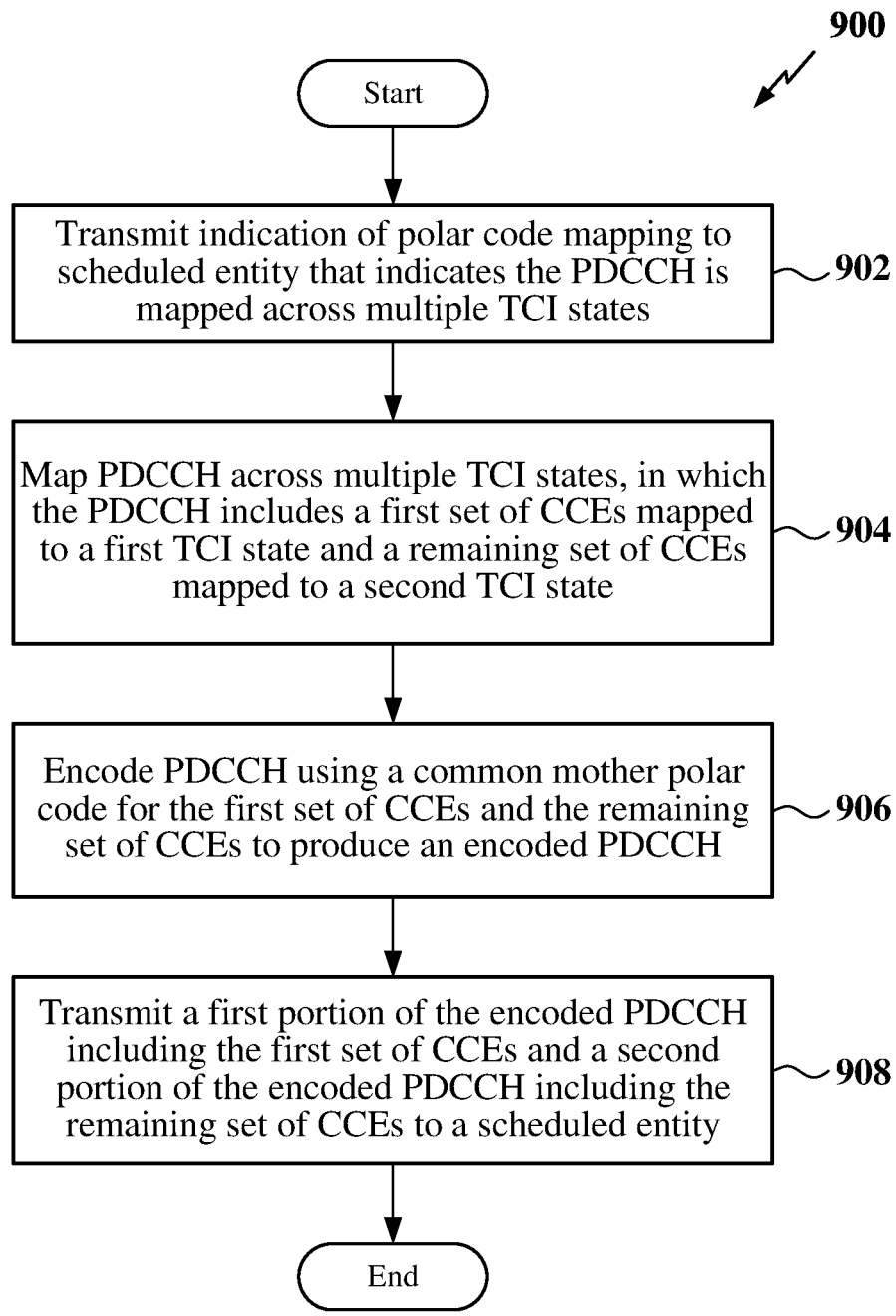
FIG. 9 is a flow chart illustrating another exemplary process for mapping a PDCCH across multiple TCI states.

FIG. 9 is a flow chart 900 of another method for mapping a PDCCH across multiple TCI states. As described below, some or all illustrated features may be omitted in a particular implementation within the scope of the present disclosure, and some illustrated features may not be required for implementation of all embodiments. In some examples, the method may be performed by the scheduling entity 700, as described above and illustrated in FIG. 7, by a processor or processing system, or by any suitable means for carrying out the described functions.

At block 902, the scheduling entity may transmit a polar code mapping indication to a scheduled entity, in which the polar code mapping indication indicates that a PDCCH is to be mapped across multiple TCI states. In some examples, the polar code mapping indication may be transmitted within DCI of another PDCCH. In other examples, the polar code mapping indication may be transmitted within a RRC message or a MAC-CE.

At block 904, the scheduling entity may map the PDCCH across multiple TCI states, in which the PDCCH includes a first set of CCEs mapped to a first TCI state and a remaining set of CCEs mapped to a second TCI state. In some examples, the scheduling entity may further map the first set of CCEs to a first control resource set (CORESET), and the remaining set of CCEs to a second CORESET. For example, the mapping circuitry 740 shown and described above in connection with FIG. 7 may map the PDCCH across multiple TCI states.

At block 906, the scheduling entity may encode the PDCCH using a common mother polar code for the first set of CCEs and the remaining set of CCEs to produce an encoded PDCCH. In some examples, the scheduling entity may receive feedback from the scheduled entity indicating the mother polar code to utilize to encode the PDCCH across multiple TCI states, and the scheduling entity may encode the PDCCH to produce the encoded PDCCH based on the feedback. For example, the encoding circuitry 742 shown and described above in connection with FIG. 7 may encode the PDCCH using a common mother polar code.

At block 908, the scheduling entity may transmit a first portion of the encoded PDCCH including the first set of CCEs and a second portion of the encoded PDCCH including the remaining set of CCEs to a scheduled entity. For example, the communication circuitry 744, together with the transceiver 710, shown and described above in connection with FIG. 7 may transmit the first and second PDCCH portions to the scheduled entity.

Figure 10:
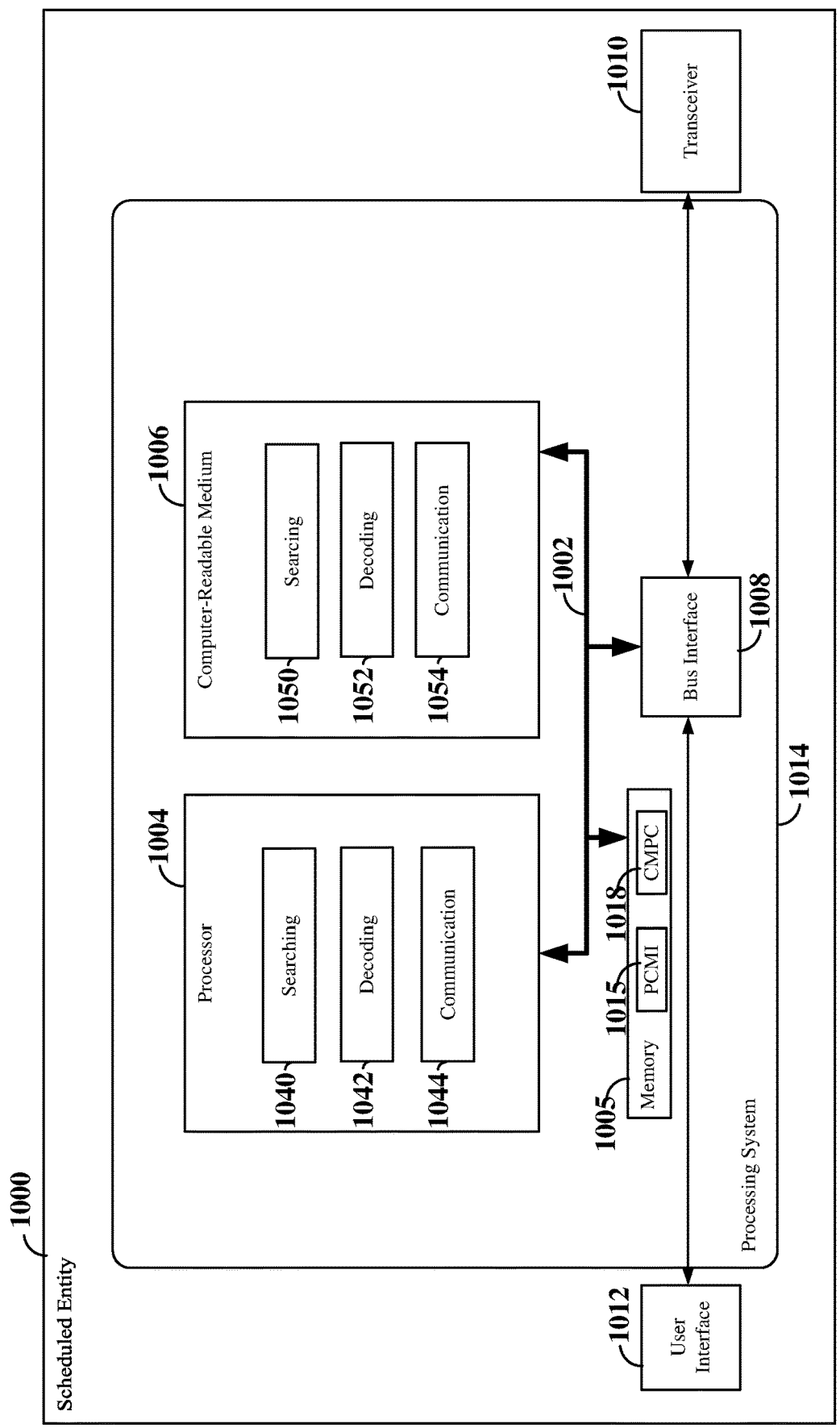
FIG. 10 is a block diagram illustrating an example of a hardware implementation for a scheduled entity employing a processing system.

FIG. 10 is a conceptual diagram illustrating an example of a hardware implementation for an exemplary scheduled entity 1000 employing a processing system 1014. In accordance with various aspects of the disclosure, an element, or any portion of an element, or any combination of elements may be implemented with a processing system 1014 that includes one or more processors 1004. For example, the scheduled entity 1000 may be a user equipment (UE) as illustrated in any one or more of FIGS. 1, 2, and/or 3.

The processing system 1014 may be substantially the same as the processing system 714 illustrated in FIG. 7, including a bus interface 1008, a bus 1002, memory 1005, a processor 1004, and a computer-readable medium 1006. Furthermore, the scheduled entity 1000 may include a user interface 1012 and a transceiver 1010 substantially similar to those described above in FIG. 7. That is, the processor 1004, as utilized in a scheduled entity 1000, may be used to implement any one or more of the processes described below and illustrated in the various figures.

Similar to processor 704, processor 1004 is responsible for managing the bus 1002 and general processing, including the execution of software stored on the computer-readable medium 1006. The software, when executed by the processor 1004, causes the processing system 1014 to perform the various functions described below for any particular apparatus. The computer-readable medium 1006 and the memory 1005 may also be used for storing data that is manipulated by the processor 1004 when executing software.

In some aspects of the disclosure, the processor 1004 may include searching circuitry 1040 configured for various functions. In some examples, the searching circuitry 1040 may be configured to search a plurality of physical downlink control channel (PDCCH) search spaces for an encoded PDCCH having a first portion that includes a first set of control channel elements (CCEs) mapped to a first transmission configuration indication (TCI) state and a second portion that includes a remaining set of CCEs mapped to a second TCI state.

In some examples, the searching circuitry 1040 may further be configured to trigger searching across TCI states upon receiving a polar code mapping mode indication (PCMI) 1015 via the transceiver 1010 that may be stored, for example, in memory 1005. The polar code mapping indication 1015 may indicate that the encoded PDCCH is mapped across multiple TCI states. For example, the searching circuitry 1040 may be configured to receive the indication within downlink control information (DCI) of another PDCCH, within an RRC message or within a MAC-CE. The searching circuitry 1040 may further be configured to execute searching software 1050 stored on the computer-readable medium 1006 to implement one or more of the functions described herein.

The processor 1004 may further include decoding circuitry 1042 configured for various functions. In some examples, the decoding circuitry 1042 may be configured to identify a common mother polar code (CMPC) 1018 that may be stored, for example, in memory 1005. In some examples, the decoding circuitry 1042 may be configured to identify the CMPC 1018 based on feedback generated and transmitted from the scheduled entity to the scheduling entity.

The decoding circuitry 1042 may further be configured to decode at least one of the first portion of the encoded PDCCH or the second portion of the encoded PDCCH according to the mother polar code. In some examples, the decoding circuitry 1042 may utilize a soft combining mechanism across TCI states to decode both the first and second portions of the encoded PDCCH. In addition, even if one of the portions is blocked (e.g., beam blockage due to movement of the scheduled entity, outage or other type of blockage), the decoding circuitry 1042 may be able to decode the other portion, since each portion is self-decodable. The decoding circuitry 1042 may further be configured to execute decoding software 1052 stored on the computer-readable medium 1006 to implement one or more of the functions described herein.

The processor 1004 may further include communication circuitry 1044 configured for various functions. The communication circuitry 1044 may include one or more hardware components that provide the physical structure that performs various processes related to wireless communication (e.g., signal reception and/or signal transmission) as described herein. The communication circuitry 1044 may include one or more hardware components that provide the physical structure that performs various processes related to signal processing (e.g., processing a received signal and/or processing a signal for transmission) as described herein.

In some examples, the communication circuitry 1044 may be configured to receive the encoded PDCCH from the scheduling entity via the transceiver 1010. The communication circuitry 1044 may further be configured to receive the PCMI 1015 from the scheduled entity via the transceiver 1010. The communication circuitry 1044 may further be configured to generate and transmit feedback indicating the CMPC 1018 to the scheduling entity. The communication circuitry 1044 may further be configured to execute communication software 1054 stored on the computer-readable medium 1006 to implement one or more of the functions described herein.

Figure 11:
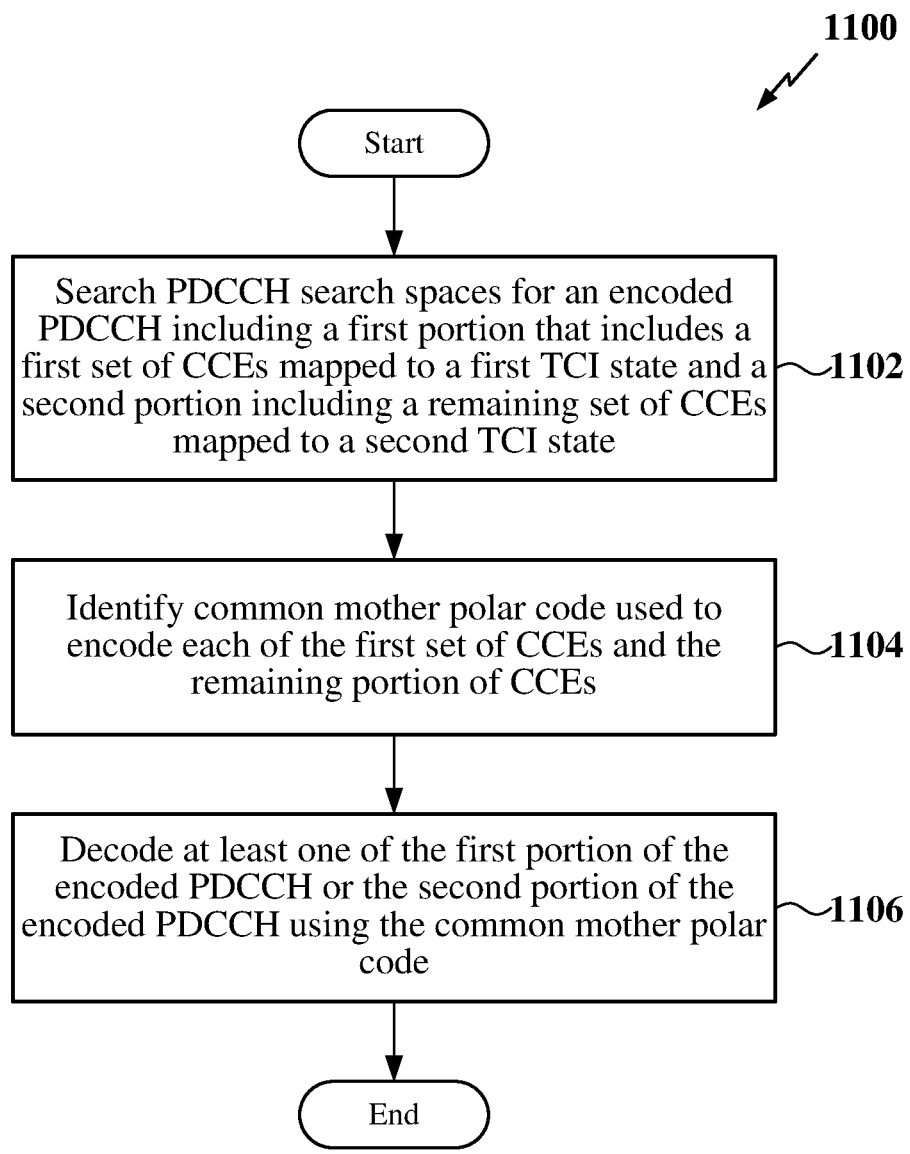
FIG. 11 is a flow chart illustrating an exemplary process for decoding a PDCCH mapped across multiple TCI states.

FIG. 11 is a flow chart 1100 of a method for decoding a PDCCH mapped across multiple TCI states. As described below, some or all illustrated features may be omitted in a particular implementation within the scope of the present disclosure, and some illustrated features may not be required for implementation of all embodiments. In some examples, the method may be performed by the scheduled entity 1000, as described above and illustrated in FIG. 10, by a processor or processing system, or by any suitable means for carrying out the described functions.

At block 1102, the scheduled entity may search a plurality of PDCCH search spaces for an encoded PDCCH including a first portion that includes a first set of CCEs mapped to a first TCI state and a second portion that includes a remaining set of CCEs mapped to a second TCI state. For example, the searching circuitry 1040 shown and described above in connection with FIG. 10 may search for the encoded PDCCH.

At block 1104, the scheduled entity may identify a common mother polar code used to encode each of the first set of CCEs and the remaining set of CCEs. In some examples, the scheduled entity may transmit feedback indicating the common mother polar code to the scheduling entity, and as such, may identify the common mother polar code from the feedback. For example, the decoding circuitry 1042 shown and described above in connection with FIG. 10 may identify the common mother polar code.

At block 1106, the scheduled entity may decode at least one of the first portion of the encoded PDCCH or the second portion of the encoded PDCCH according to the common mother polar code. In some examples, the scheduled entity may utilize a soft combining mechanism across TCI states to decode both the first and second portions of the encoded PDCCH. In addition, even if one of the portions is blocked (e.g., beam blockage due to movement of the scheduled entity, outage or other type of blockage), the scheduled entity may be able to decode the other portion, since each portion is self-decodable. For example, the decoding circuitry 1042 shown and described above in connection with FIG. 10 may decode the encoded PDCCH.

Figure 12:
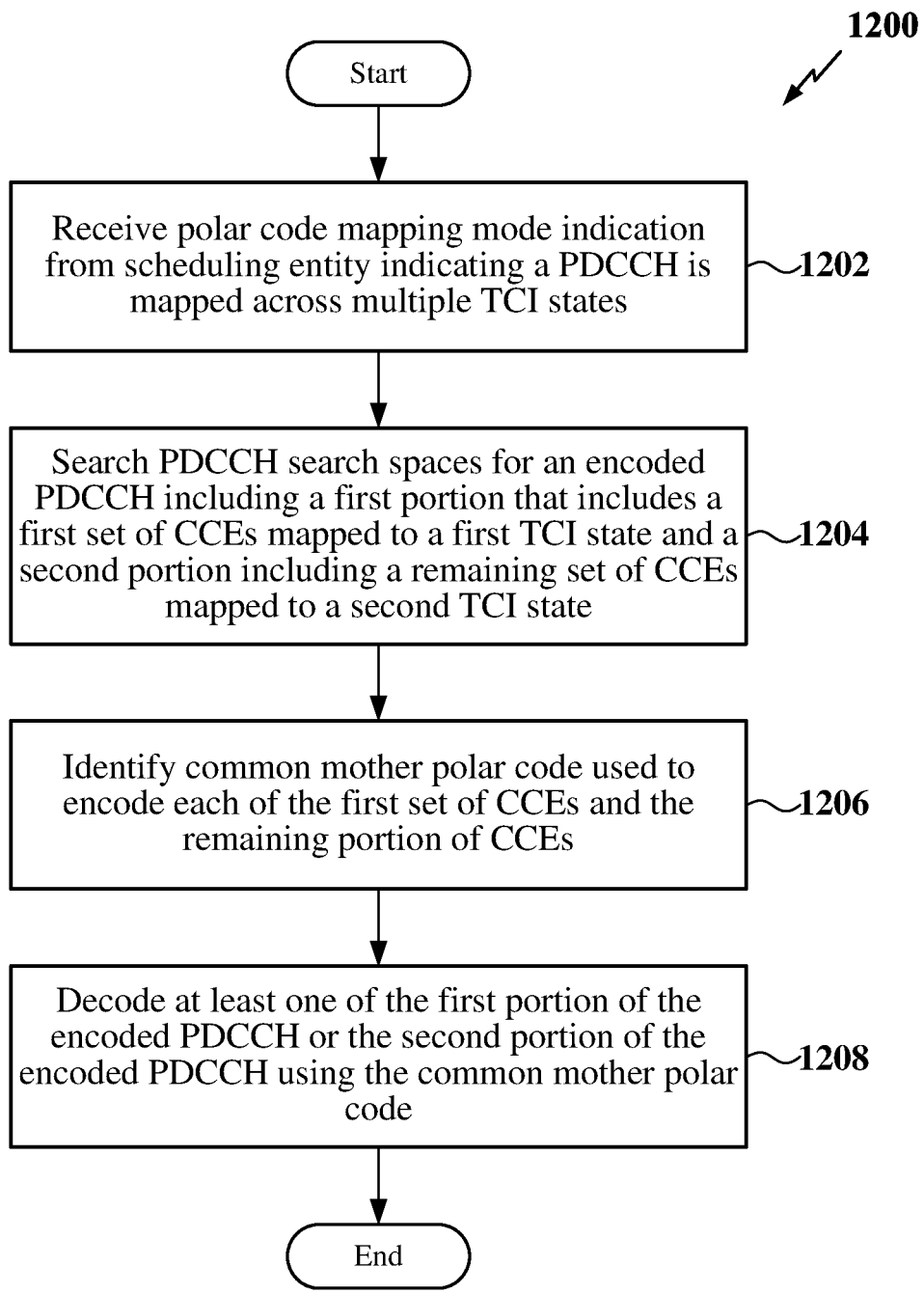
FIG. 12 is a flow chart illustrating another exemplary process for decoding a PDCCH mapped across multiple TCI states.

FIG. 12 is a flow chart 1200 of a method for decoding a PDCCH mapped across multiple TCI states. As described below, some or all illustrated features may be omitted in a particular implementation within the scope of the present disclosure, and some illustrated features may not be required for implementation of all embodiments. In some examples, the method may be performed by the scheduled entity 1000, as described above and illustrated in FIG. 10, by a processor or processing system, or by any suitable means for carrying out the described functions.

At block 1202, the scheduled entity may receive a polar code mapping mode indication from the scheduling entity indicating that a PDCCH is to be mapped across multiple TCI states. In some examples, the polar code mapping mode indication may be received within DCI, an RRC message, or a MAC-CE. For example, the communication circuitry 1044 shown and described above in connection with FIG. 10 may receive the polar code mapping mode indication.

At block 1204, the scheduled entity may search a plurality of PDCCH search spaces for an encoded PDCCH including a first portion that includes a first set of CCEs mapped to a first TCI state and a second portion that includes a remaining set of CCEs mapped to a second TCI state. For example, the searching circuitry 1040 shown and described above in connection with FIG. 10 may search for the encoded PDCCH.

At block 1206, the scheduled entity may identify a common mother polar code used to encode each of the first set of CCEs and the remaining set of CCEs. In some examples, the scheduled entity may transmit feedback indicating the common mother polar code to the scheduling entity, and as such, may identify the common mother polar code from the feedback. For example, the decoding circuitry 1042 shown and described above in connection with FIG. 10 may identify the common mother polar code.

At block 1208, the scheduled entity may decode at least one of the first portion of the encoded PDCCH or the second portion of the encoded PDCCH according to the common mother polar code. In some examples, the scheduled entity may utilize a soft combining mechanism across TCI states to decode both the first and second portions of the encoded PDCCH. In addition, even if one of the portions is blocked (e.g., beam blockage due to movement of the scheduled entity, outage or other type of blockage), the scheduled entity may be able to decode the other portion, since each portion is self-decodable. For example, the decoding circuitry 1042 shown and described above in connection with FIG. 10 may decode the encoded PDCCH.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-12 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3, 7, and/or 10 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication at a scheduling entity, comprising:
    mapping a physical downlink control channel (PDCCH) across multiple transmission configuration indication (TCI) states, the PDCCH comprising a first set of control channel elements (CCEs) mapped to a first TCI state indicating a first beam and a remaining set of CCEs mapped to a second TCI state indicating a second beam different than the first beam, wherein each of the first set of CCEs and the remaining set of CCEs are contiguous in frequency within a same symbol;
    receiving feedback from the scheduled entity including a common mother polar code to be utilized by the scheduling entity;
    encoding the PDCCH to produce an encoded PDCCH based on the feedback, wherein each of the first set of CCEs and the remaining set of CCEs are encoded according to the common mother polar code; and
    transmitting each of a first portion of the encoded PDCCH and a second portion of the encoded PDCCH to a scheduled entity, wherein the first portion of the encoded PDCCH comprises the first set of CCEs, and wherein the second portion of the encoded PDCCH comprises the remaining set of CCEs.

2. The method of claim 1, further comprising:
    transmitting a polar code mapping mode indication to the scheduled entity, wherein the polar code mapping mode indication indicates that the PDCCH is mapped across the multiple TCI states.

3. The method of claim 2, wherein transmitting the polar code mapping mode indication further comprises:
    transmitting the polar code mapping mode indication within downlink control information (DCI).

4. The method of claim 2, wherein transmitting the polar code mapping mode indication further comprises:
    transmitting the polar code mapping mode indication within a radio resource control (RRC) message.

5. The method of claim 2, wherein transmitting the polar code mapping mode indication further comprises:
    transmitting the polar code mapping mode indication within a medium access control-control element (MAC-CE).

6. The method of claim 1, wherein mapping the PDCCH across multiple TCI states further comprises:

mapping the first set of CCEs to a first control resource set (CORESET); and
mapping the remaining set of CCEs is mapped to a second CORESET.

7. A scheduling entity in a wireless communication network, comprising:
a processor;
a transceiver communicatively coupled to the processor; and
a memory communicatively coupled to the processor, wherein the processor is configured to:
map a physical downlink control channel (PDCCH) across multiple transmission configuration indication (TCI) states, the PDCCH comprising a first set of control channel elements (CCEs) mapped to a first TCI state indicating a first beam and a remaining set of CCEs mapped to a second TCI state indicating a second beam different than the first beam, wherein each of the first set of CCEs and the remaining set of CCEs are contiguous in frequency within a same symbol;
receive feedback from the scheduled entity including a common mother polar code to be utilized by the scheduling entity;
encode the PDCCH to produce an encoded PDCCH based on the feedback, wherein each of the first set of CCEs and the remaining set of CCEs are encoded according to the common mother polar code; and
transmit each of a first portion of the encoded PDCCH and a second portion of the encoded PDCCH to a scheduled entity via the transceiver, wherein the first portion of the encoded PDCCH comprises the first set of CCEs, and wherein the second portion of the encoded PDCCH comprises the remaining set of CCEs.

8. The scheduling entity of claim 7, wherein the processor is further configured to:
transmit a polar code mapping mode indication to the scheduled entity, wherein the polar code mapping mode indication indicates that the PDCCH is mapped across the multiple TCI states.

9. The scheduling entity of claim 8, wherein the processor is further configured to:
transmit the polar code mapping mode indication within downlink control information (DCI).

10. The scheduling entity of claim 8, wherein the processor is further configured to:
transmit the polar code mapping mode indication within a radio resource control (RRC) message.

11. The scheduling entity of claim 8, wherein the processor is further configured to:
transmit the polar code mapping mode indication within a medium access control-control element (MAC-CE).

12. The scheduling entity of claim 7, wherein the processor is further configured to:
map the first set of CCEs to a first control resource set (CORESET); and
map the remaining set of CCEs is mapped to a second CORESET.

13. A method of wireless communication at a scheduled entity, comprising:
transmitting, to a scheduling entity, feedback including a common mother polar code to be utilized by the scheduling entity;
searching a plurality of physical downlink control channel (PDCCH) search spaces for an encoded PDCCH transmitted by the scheduling entity, the encoded PDCCH comprising a first portion comprising a first set of control channel elements (CCEs) mapped to a first transmission configuration indication (TCI) state indicating a first beam and a second portion comprising a remaining set of CCEs mapped to a second TCI state indicating a second beam different than the first beam, wherein each of the first set of CCEs and the remaining set of CCEs are contiguous in frequency within a same symbol;
identifying the common mother polar code used to encode each of the first set of CCEs and the remaining set of CCEs; and
decoding at least one of the first portion of the encoded PDCCH or the second portion of the encoded PDCCH according to the common mother polar code.

14. The method of claim 13, further comprising:
receiving a polar code mapping mode indication that indicates that the encoded PDCCH is mapped across the multiple TCI states.

15. The method of claim 14, wherein receiving the polar code mapping mode indication further comprises:
receiving the polar code mapping mode indication within downlink control information (DCI).

16. The method of claim 14, wherein receiving the polar code mapping mode indication further comprises:
receiving the polar code mapping mode indication within a radio resource control (RRC) message.

17. The method of claim 14, wherein receiving the polar code mapping mode indication further comprises:
receiving the polar code mapping mode indication within a medium access control-control element (MAC-CE).

18. The method of claim 13, wherein searching the plurality of physical downlink control channel (PDCCH) search spaces for the encoded PDCCH transmitted by the scheduling entity further comprises:
searching for the first set of CCEs mapped to a first control resource set (CORESET) and the remaining set of CCEs mapped to a second CORESET.

19. A scheduled entity in a wireless communication network, comprising:
a processor;
a transceiver communicatively coupled to the processor; and
a memory communicatively coupled to the processor, wherein the processor is configured to:
transmit, to a scheduling entity, feedback including a common mother polar code to be utilized by the scheduling entity;
search a plurality of physical downlink control channel (PDCCH) search spaces for an encoded PDCCH transmitted by the scheduling entity, the encoded PDCCH comprising a first portion comprising a first set of control channel elements (CCEs) mapped to a first transmission configuration indication (TCI) state indicating a first beam and a second portion comprising a remaining set of CCEs mapped to a second TCI state indicating a second beam different than the first beam, wherein each of the first set of CCEs and the remaining set of CCEs are contiguous in frequency within a same symbol;
identify the common mother polar code used to encode each of the first set of CCEs and the remaining set of CCEs; and
decode at least one of the first portion of the encoded PDCCH or the second portion of the encoded PDCCH according to the common mother polar code.

20. The scheduled entity of claim 19, wherein the processor is further configured to:
  receive a polar code mapping mode indication from the scheduling entity that indicates that the encoded PDCCH is mapped across the multiple TCI states via the transceiver.

21. The scheduled entity of claim 20, wherein the processor is further configured to:
  receive the polar code mapping mode indication within downlink control information (DCI).

22. The scheduled entity of claim 20, wherein the processor is further configured to:
  receive the polar code mapping mode indication within a radio resource control (RRC) message.

23. The scheduled entity of claim 20, wherein the processor is further configured to:
  receive the polar code mapping mode indication within a medium access control-control element (MAC-CE).

24. The scheduled entity of claim 19, wherein the processor is further configured to:
  search for the first set of CCEs mapped to a first control resource set (CORESET) and the remaining set of CCEs mapped to a second CORESET.

* * * * *